(12) United States Patent
Brezza et al.

(10) Patent No.: US 11,417,756 B2
(45) Date of Patent: Aug. 16, 2022

(54) METHOD FOR MANUFACTURING A BIPOLAR TRANSISTOR AND BIPOLAR TRANSISTOR CAPABLE OF BEING OBTAINED BY SUCH A METHOD

(71) Applicant: STMicroelectronics (Crolles 2) SAS, Crolles (FR)

(72) Inventors: Edoardo Brezza, Grenoble (FR); Alexis Gauthier, Meylan (FR); Fabien Deprat, Chambery (FR); Pascal Chevalier, Chapareillan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/175,758

(22) Filed: Feb. 15, 2021

(65) Prior Publication Data

US 2021/0273082 A1   Sep. 2, 2021

(30) Foreign Application Priority Data

Feb. 28, 2020 (FR) ...................................... 2001986

(51) Int. Cl.
*H01L 29/737* (2006.01)
*H01L 21/8249* (2006.01)
*H01L 29/08* (2006.01)
*H01L 29/417* (2006.01)
*H01L 29/66* (2006.01)

(52) U.S. Cl.
CPC ...... *H01L 29/7371* (2013.01); *H01L 21/8249* (2013.01); *H01L 29/0817* (2013.01); *H01L 29/41708* (2013.01); *H01L 29/66318* (2013.01)

(58) Field of Classification Search
CPC ............ H01L 29/7371; H01L 21/8249; H01L 29/0817; H01L 29/41708; H01L 29/66318; H01L 29/1004; H01L 29/7378; H01L 29/7375; H01L 29/66242; H01L 29/0821; H01L 29/66272
See application file for complete search history.

(56) References Cited

U.S. PATENT DOCUMENTS 10,186,605 B1   1/2019  Gauthier et al.
10,224,423 B1   3/2019  Gauthier et al.
(Continued)

OTHER PUBLICATIONS

INPI Search Report and Written Opinion for FR Appl. No. 2001986 dated Dec. 2, 2020 (9 pages).

*Primary Examiner* — Syed I Gheyas
(74) *Attorney, Agent, or Firm* — Crowe & Dunlevy

(57) ABSTRACT

A method of making a bipolar transistor includes forming a stack of a first, second, third and fourth insulating layers on a substrate. An opening is formed in the stack to reach the substrate. An epitaxial process forms the collector of the transistor on the substrate and selectively etches an annular opening in the third layer. The intrinsic part of the base is then formed by epitaxy on the collector, with the intrinsic part being separated from the third layer by the annular opening. The junction between the collector and the intrinsic part of the base is surrounded by the second layer. The emitter is formed on the intrinsic part and the third layer is removed. A selective deposition of a semiconductor layer on the second layer and in direct contact with the intrinsic part forms the extrinsic part of the base.

30 Claims, 6 Drawing Sheets

(56) References Cited

U.S. PATENT DOCUMENTS

| | | | |
|---|---|---|---|
| 2015/0140771 A1* | 5/2015 | Fox | H01L 29/1004 |
| | | | 438/320 |
| 2016/0190277 A1 | 6/2016 | Tschumakow et al. | |
| 2016/0322257 A1* | 11/2016 | Hoffmann | H01L 29/7371 |
| 2018/0286968 A1 | 10/2018 | Jain et al. | |
| 2019/0259838 A1 | 8/2019 | Gauthier et al. | |

* cited by examiner

METHOD FOR MANUFACTURING A BIPOLAR TRANSISTOR AND BIPOLAR TRANSISTOR CAPABLE OF BEING OBTAINED BY SUCH A METHOD

PRIORITY CLAIM

This application claims the priority benefit of French Application for Patent No. 2001986, filed on Feb. 28, 2020, the content of which is hereby incorporated by reference in its entirety to the maximum extent allowable by law.

TECHNICAL FIELD

The present text relates to a method for manufacturing a bipolar transistor and a bipolar transistor capable of being obtained by such a method.

BACKGROUND

A bipolar transistor comprises an emitter, a base and a collector superimposed on a semiconductor substrate.

The base comprises a so-called intrinsic part, which is the active region of the transistor, forming a junction with the collector at the level of its lower part and with the emitter at the level of its upper part, and a so-called extrinsic part, which is a region of electrical connection extending laterally with respect to the intrinsic base, through which the intrinsic part may be polarized during the operation of the transistor.

To reduce the base-collector capacitance, it is desirable to electrically insulate the collector from the extrinsic part of the base.

Such insulation may be achieved by means of an air gap surrounding the base-collector junction, making it possible to avoid any contact between the extrinsic part of the base and the collector.

FIG. 1 illustrates a bipolar transistor formed on a semiconductor substrate 1. The collector C is formed in part in an electrically insulating layer 11. The upper part of the collector C, which forms a junction with the intrinsic part B1 of the base B, is surrounded by an air gap 3'. The intrinsic part B1 has a T-shape and is connected to a semiconductor layer 13 which forms the extrinsic part B2 of the base by a lateral portion B3, which is formed after the part B1 and has different electrical properties. The air gap 3' is delimited by the electrically insulating layer 11, the semiconductor layer 13 and an electrically insulating layer 12 extending under the head of the T-shape of the intrinsic part of the base.

U.S. Pat. Nos. 10,186,605 and 10,224,423, incorporated by reference, describe methods making it possible to form such an air gap.

However, these methods are particularly complex on account of the number of steps to implement in order to connect the extrinsic part to the intrinsic part of the base. In addition, it is difficult to control the dimensions of the air gap, which brings about risks of short-circuit between the extrinsic part of the base and the collector.

There thus remains a need to design a method for manufacturing a bipolar transistor which makes it possible to electrically insulate the extrinsic part of the base vis-à-vis the collector, in a robust manner and with a minimum number of steps.

SUMMARY

In an embodiment, a method for manufacturing a bipolar transistor including a collector, a base and an emitter, comprises: forming, on a semiconductor substrate, a stack successively comprising: a first layer, a second layer, a third layer and a fourth layer, wherein each of the first to fourth layers is able to be etched selectively compared to each adjacent layer, the first, second and fourth layers being electrically insulating; forming an opening in the stack up to the substrate; forming by epitaxy on the substrate of the collector of the bipolar transistor and the formation by selective etching of an annular opening in the third layer; forming an intrinsic part of the base by epitaxy on the collector, said intrinsic part being separated from the third layer by an air gap formed in the annular opening, the junction between the collector and the intrinsic part of the base being surrounded by the second layer; forming the emitter on the intrinsic part of the base; removing the third layer by selective etching; and selectively depositing a semiconductor layer on the second layer, in direct contact with the intrinsic part of the base, so as to form an extrinsic part of the base of the bipolar transistor.

The phrase "intrinsic part of the base" is understood to mean in the context of present text the portion of the bipolar transistor which forms a P-N junction respectively with the collector and with the emitter. The phrase "extrinsic part of the base" is understood to mean in the context of the present text a region of electrical contact extending laterally with respect to the intrinsic part of the base, the function of which is thus to polarize the base of the bipolar transistor.

In certain embodiments, forming the emitter comprises forming an opening in the fourth layer up to the intrinsic part of the base and non-selectively depositing a semiconductor material on the fourth layer and on the intrinsic part of the base.

In certain embodiments, forming the extrinsic part of the base comprises a first phase of growing the semiconductor layer laterally from an edge of the intrinsic part of the base, followed by a second phase of growing the semiconductor layer from the surface of the second electrically insulating layer in a direction perpendicular to said surface.

In other embodiments, forming the extrinsic part of the base comprises a phase of depositing a first semiconductor layer on the second electrically insulating layer followed by selectively depositing the semiconductor layer on said first semiconductor layer.

In certain embodiments, the first, second and fourth layers are formed of a silicon oxide ($SiO_2$) material or a silicon nitride ($Si_3N_4$) material.

In particular, the first and fourth layers may be silicon oxide layers and the second layer may be a silicon nitride layer.

In certain embodiments, the third layer is a polycrystalline silicon-germanium layer.

In certain embodiments, the semiconductor layer forming the extrinsic part of the base is a polycrystalline silicon layer.

In certain embodiments, the intrinsic part of the base comprises silicon-germanium.

In certain embodiments, the third layer and the intrinsic part of the base are made of silicon-germanium and the germanium content of the third layer is at least 1.5 times higher than the germanium content of the intrinsic part of the base.

In certain embodiments, the method comprises, before forming the emitter, forming spacers on the intrinsic part of the base.

In particular, forming spacers may comprise: depositing a silicon oxide layer on the intrinsic part of the base; depositing a silicon nitride layer on the silicon oxide layer; and forming an opening in said silicon nitride and silicon oxide layers up to the intrinsic part of the base, so as to delimit said spacers in the silicon oxide layer.

In an embodiment, a structure comprises a bipolar transistor capable of being obtained by the method described above.

Said structure comprises a bipolar transistor including a collector, a base and an emitter, said structure comprising: a semiconductor substrate; a stack successively comprising from the substrate: a first electrically insulating layer, a second electrically insulating layer made of a material different to that of the first electrically insulating layer and a semiconductor layer, said stack comprising a window extending up to the substrate; the collector, an intrinsic part of the base and the emitter being successively stacked on the substrate in said window, the junction between the collector and the intrinsic part of the base being surrounded by the second electrically insulating layer, the semiconductor layer forming an extrinsic part of the base of the bipolar transistor.

In certain embodiments, the second electrically insulating layer is in direct contact with the junction between the collector and the intrinsic part of the base.

In certain embodiments, the first electrically insulating layer is made of silicon oxide and the second electrically insulating layer is made of silicon nitride.

In certain embodiments, the semiconductor layer forming the extrinsic part of the base is made of polycrystalline silicon.

BRIEF DESCRIPTION OF THE DRAWINGS

Other characteristics and advantages of these embodiments will become clear in the detailed description that follows, with reference to the appended drawings in which.

For reasons of legibility of the figures, the drawings are not drawn to scale. Furthermore, the drawings have been simplified so as to only show elements useful for the understanding of the figures.

DETAILED DESCRIPTION

In the present text, the terms "lateral", "lower", "upper", "under", "on", "above", "below", etc. are understood with respect to the orientation of the elements considered in the figures.

Figure 2:
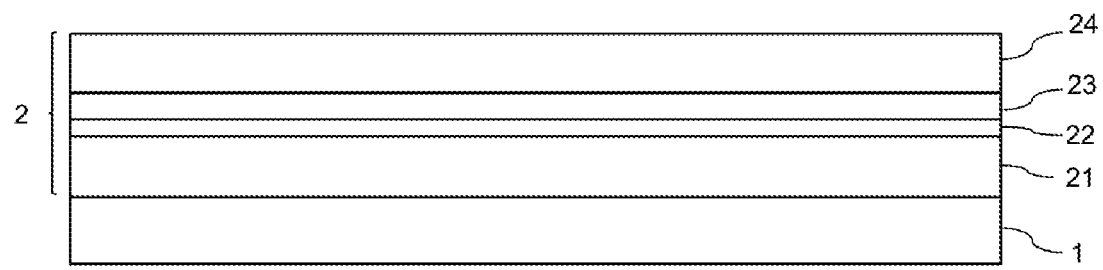
FIG. 2 is a schematic sectional view of a stack of layers formed on a substrate.

With reference to FIG. 2, a stack 2 of the following four successive (and adjacent) layers are formed on a substrate 1: a first layer 21, a second layer 22 on and in contact with the first layer 21, a third layer 23 on and in contact with the second layer 22, and a fourth layer 24 on and in contact with the third layer 23.

The substrate 1 is a monocrystalline semiconductor substrate, optionally doped. For example, the substrate 1 may be a monocrystalline silicon substrate. As will be described hereafter, the substrate 1 must in fact serve as seed for the epitaxial growth of the collector, the base and the emitter of a bipolar transistor.

The first, the second and the fourth layer of the stack are electrically insulating. For example, said layers may be formed of silicon oxide ($SiO_2$) or silicon nitride ($Si_3N_4$).

Furthermore, each of the layers 21 to 24 is able to be etched selectively compared to each adjacent layer.

Thus, in certain embodiments, the layers 21 and 24 are silicon oxide layers and the layer 22 a silicon nitride layer.

The third layer 23 is advantageously a polycrystalline silicon-germanium layer, which is able to be etched selectively compared to the layers 22 and 24 and compared to the material of the intrinsic part of the base which will be formed later.

Naturally, these materials are given as examples and those skilled in the art could choose other materials meeting the aforementioned conditions.

Figure 3:
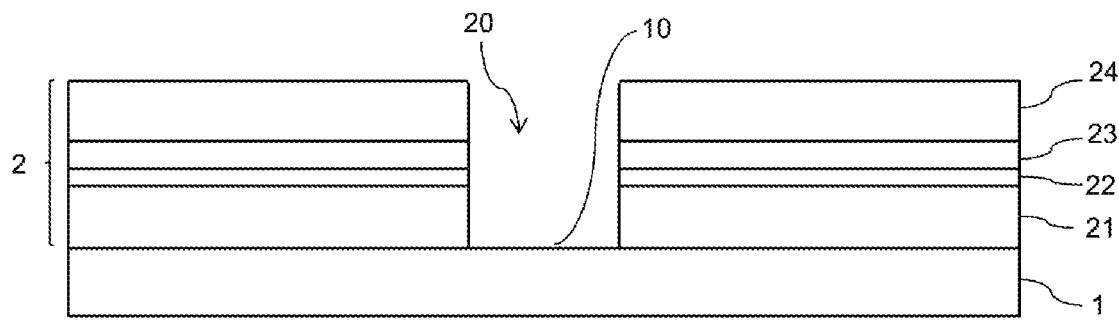
FIG. 3 is a schematic sectional view of the structure of FIG. 2 after formation of an opening in the stack.

With reference to FIG. 3, an opening 20 extending up to the substrate 1 has been formed in the stack 2, so as to expose the surface 10 of the substrate 1.

Such an opening may be formed by etching through a mask (not represented), notably by dry etching. The etching implements agents of composition suited to successively etching the layers 24, 23, 22 and 21. This etching is essentially anisotropic, that is to say mainly in the direction of the thickness of the stack. The choice of the etching agents as a function of the materials to etch is within the reach of those skilled in the art and will not be detailed in the present text.

The opening 20 forms a window in which the collector, the base and the emitter must be formed from the surface 10 of the substrate 1.

Figure 4:
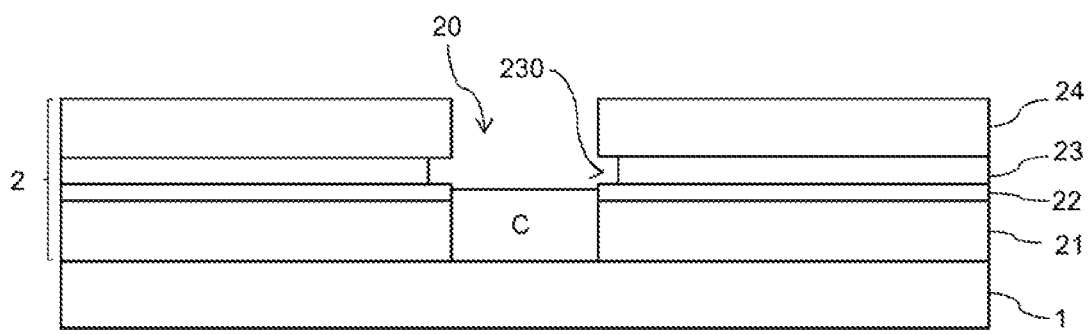
FIG. 4 is a schematic sectional view of the structure of FIG. 3 after formation by epitaxy of the collector of a bipolar transistor on the substrate.

With reference to FIG. 4, a selective cyclic epitaxy method has been implemented to grow the collector C of the bipolar transistor while laterally etching the layer 23.

The substrate 1, which is monocrystalline, serves as seed for the epitaxial growth of the collector. The collector is formed of a monocrystalline semiconductor material of which the lattice parameter is as similar as possible to the lattice parameter of the substrate 1 in order to avoid the generation of crystalline defects in the collector. Advantageously, the substrate 1 and the collector C are both made of monocrystalline silicon. The collector C may be doped during or after the epitaxy, by means known to those skilled in the art. In the case of an NPN transistor, the doping of the collector may be carried out with arsenic or phosphorous, with a dose typically of the order of $10^{18}$ to $10^{19}$ cm$^{-3}$. In the case of a PNP transistor, the doping of the collector may be carried out with boron or indium, with a dose typically of the order of $10^{18}$ to $10^{19}$ cm$^{-3}$.

Each selective epitaxy cycle comprises an etching step and a growth step. The rate of growth is different depending on the material from which the growth is implemented. The selectivity of the epitaxy is procured by the etching which makes it possible to eliminate the material deposited in the places where growth is less rapid.

Each selective etching step implements an etching agent which etches more rapidly the polycrystalline silicon-germanium of the layer 23 than the silicon of the collector. For example, the etching agent comprises hydrochloric acid (HCl). Each selective etching step makes it possible to form an annular opening 230 extending laterally around the opening 20 in the layer 23. The width of said opening 230 is of the order of several tens of nanometers on each side of the opening 20.

Each selective epitaxy step makes it possible to grow preferentially monocrystalline silicon on the surface 10 of the substrate 1, the crystal lattice of the substrate 1 serving as seed for the growth of the collector C.

The growth of the collector is stopped when the upper surface of the collector is situated between the upper surface of the silicon oxide layer 21 and the upper surface of the silicon nitride layer 22.

Figure 5:
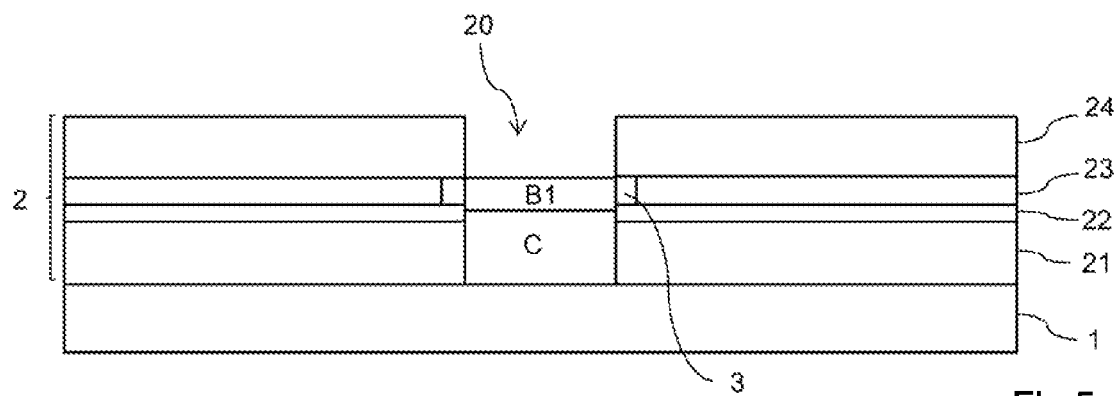
FIG. 5 is a schematic sectional view of the structure of FIG. 4 after formation by epitaxy of the base of the bipolar transistor on the collector.

With reference to FIG. 5, the epitaxy has been continued to grow the base of the bipolar transistor (more precisely, the intrinsic part B1 of the base) on the collector C. The collector, which is monocrystalline, serves as seed for the epitaxial growth of the base. The base is formed of a monocrystalline semiconductor material of which the lattice parameter is as similar as possible to the lattice parameter of the collector C in order to avoid the generation of crystalline defects in the collector. Advantageously, the substrate 1 and the collector C are made of monocrystalline silicon, whereas the base B1 is made of monocrystalline silicon-germanium. The germanium content of the layer 23 is sufficiently high compared to the germanium content of the base B1 (for example, more than 1.5 times higher) to ensure selectivity of the etching of the layer 23 vis-à-vis the base B1, in order not to damage the base during the etching of the layer 23 (step shown schematically in FIG. 14). The base is doped with a type opposite to that of the collector to form a P-N junction, which is in contact laterally with the electrically insulating layer 22.

Thanks to the annular opening 230 formed in the layer 23, the base grows uniquely from the monocrystalline material of the collector, at a distance from the polycrystalline material of the layer 23, which makes it possible to optimize the crystalline quality of the base. Indeed, if the base was in contact with the layer 23, the material of the base would also be deposited on the edge of this layer, which is constituted of a material different from that of the base and which is not monocrystalline, which would induce crystalline defects in the base.

The growth of the base is stopped when the upper surface of the base reaches the upper surface of the polycrystalline silicon-germanium layer 23.

At the end of growth of the base, the annular opening 230 is thus delimited internally by the base to form an air gap 3. It will be noted however that this air gap is not situated at the same location as the air gap 3' in the bipolar transistor of FIG. 1, and that it does not fulfil the same function. Indeed, whereas the air gap 3' of the bipolar transistor of FIG. 1 was intended to avoid electrical contact between the base-collector junction and the extrinsic part of the base, the air gap 3 of FIG. 5 is intended to optimize the crystalline quality of the intrinsic part of the base. As will be seen hereafter, the air gap 3 will disappear in a later step of the method for manufacturing the bipolar transistor and will thus not be present in the final bipolar transistor.

Figure 6:
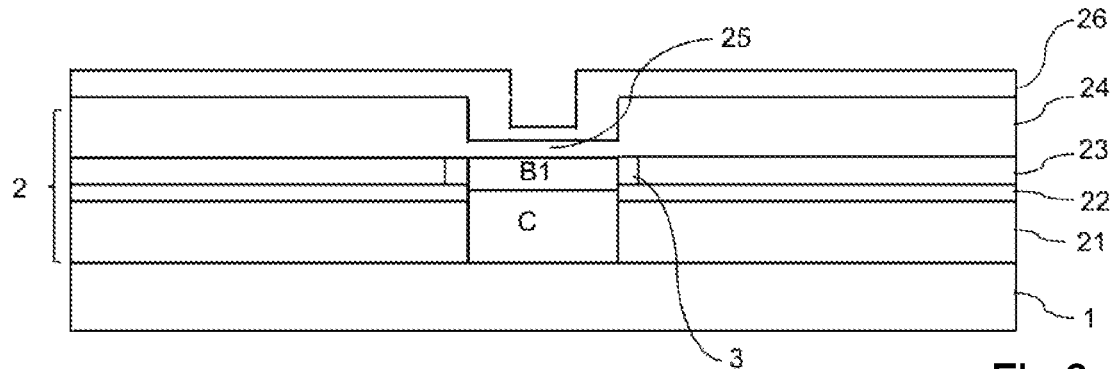
FIG. 6 is a schematic sectional view of the structure of FIG. 5 after deposition of a silicon oxide and silicon nitride layer.

With reference to FIG. 6, an additional silicon oxide layer and a silicon nitride layer 26 on the silicon oxide layer 25 has been deposited on the structure of FIG. 5. These two layers are intended to form the spacers of the emitter that will be formed subsequently. The deposition of silicon oxide being conformal, it makes it possible to form a layer of uniform thickness over the entire exposed surface, which next makes it possible to obtain spacers having an optimal shape.

Figure 7:
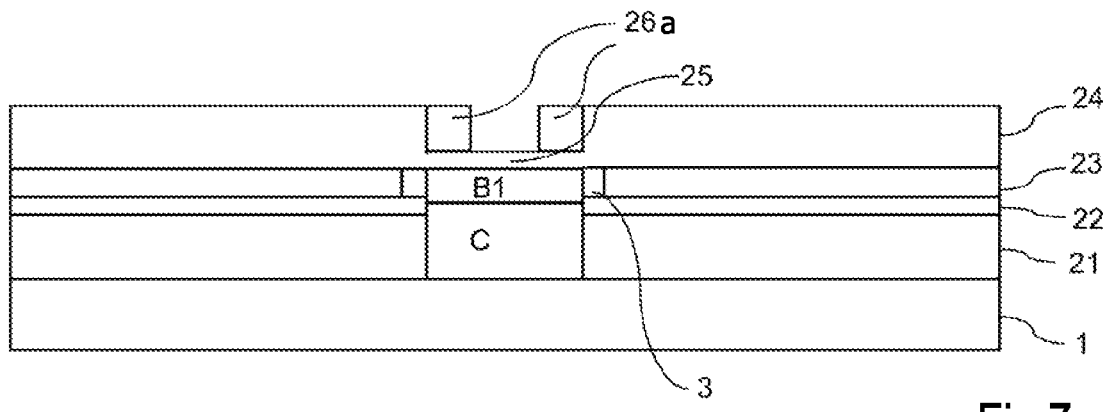
FIG. 7 is a schematic sectional view of the structure of FIG. 6 after etching of a part of the silicon nitride layer.

With reference to FIG. 7, the silicon nitride layer 26 has been etched over the entire surface of the structure. At the end of this etching step, there only remains two silicon nitride pads 26a in the opening.

Figure 8:
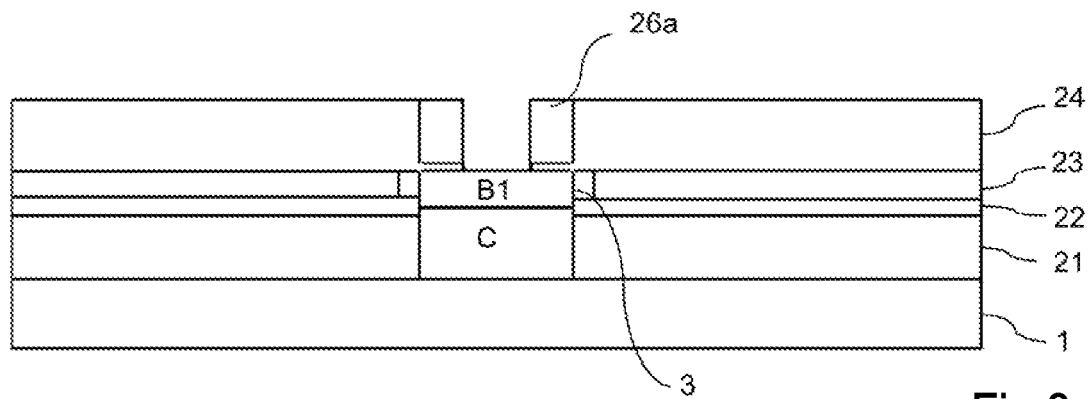
FIG. 8 is a schematic sectional view of the structure of FIG. 7 after formation of an opening exposing the upper surface of the base of the bipolar transistor.

With reference to FIG. 8, an opening has been formed between the pads 26a by removing the oxide layer present between said pads, in order to expose the upper surface of the intrinsic part B1 of the base.

Figure 9:
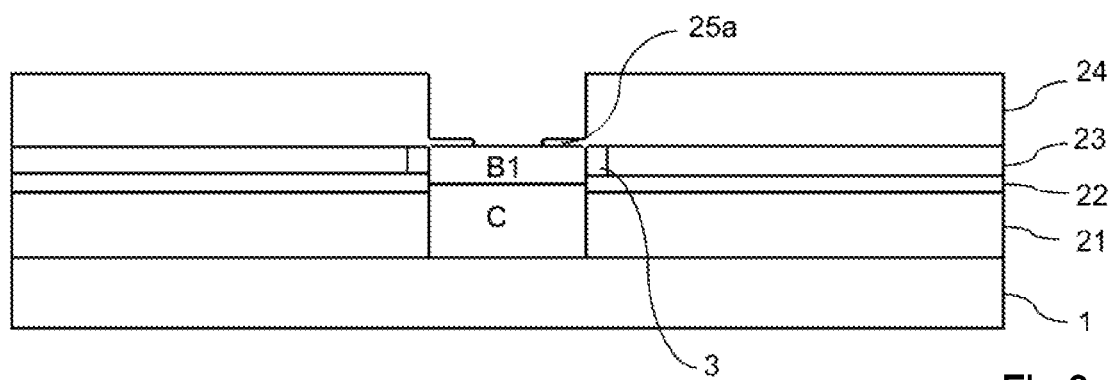
FIG. 9 is a schematic sectional view of the structure of FIG. 8 after removal of silicon nitride pads.

With reference to FIG. 9, the silicon nitride pads 26a have been removed, such that there only remains on the intrinsic part B1 of the base two spacers 25a which are the residual portions of the silicon oxide layer 25.

Figure 10:
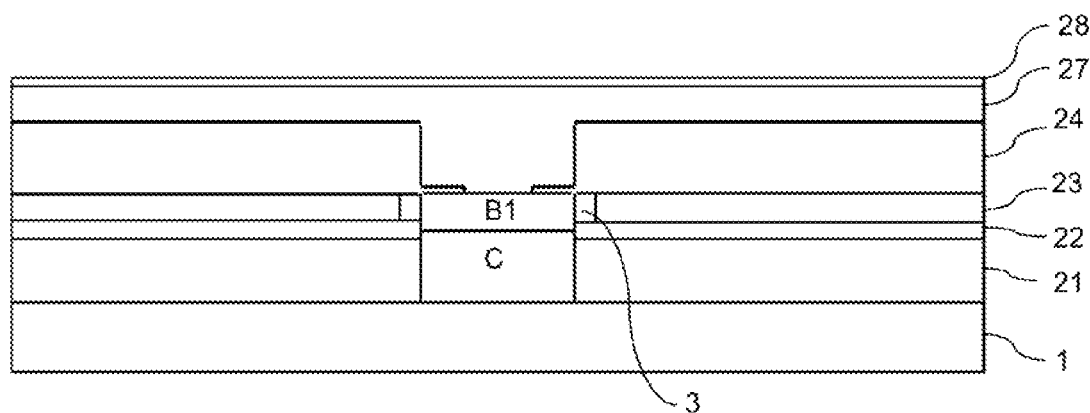
FIG. 10 is a schematic sectional view of the structure of FIG. 9 after deposition of the material forming the emitter of the bipolar transistor and a protective layer.

With reference to FIG. 10, a deposition of polycrystalline silicon intended to form the emitter has been implemented. This deposition not being selective, the polycrystalline silicon layer 27 has been deposited at one and the same time on the silicon oxide layer 24, on the spacers 25a and on the intrinsic part B1 of the base. The layer 27 is doped with a type opposite to that of the base, to form a P-N junction between the base and the emitter. In the case of an NPN transistor, the doping of the emitter may be carried out with arsenic, with a dose typically of the order of $10^{20}$ to $10^{21}$ cm$^{-3}$. In the case of a PNP transistor, the doping of the emitter may be carried out with boron, with a dose typically of the order of $10^{20}$ to $10^{21}$ cm$^{-3}$.

The layer 27 has next been covered with an electrically insulating protective layer 28, for example made of silicon oxide.

Figure 11:
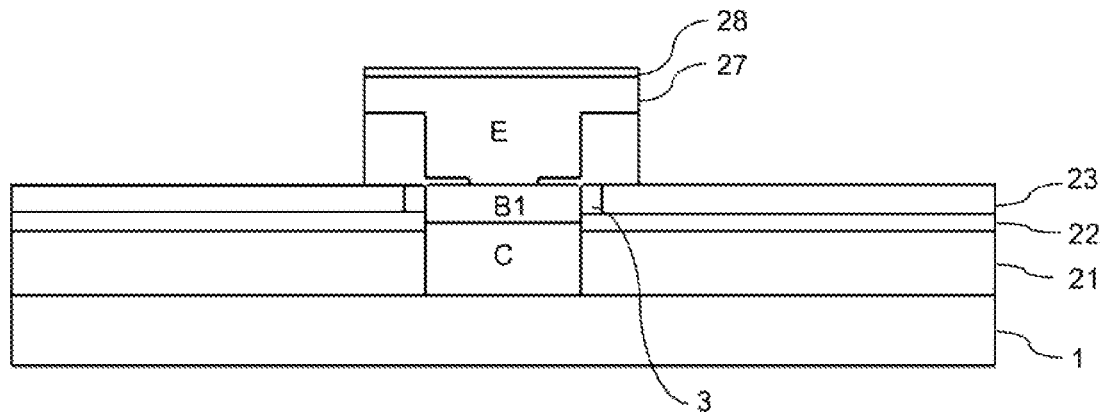
FIG. 11 is a schematic sectional view of the structure of FIG. 10 after delimitation of the emitter of the bipolar transistor.

With reference to FIG. 11, a localized etching is implemented through a mask (not represented) to define the emitter E in the polycrystalline silicon layer 27. In the regions of the structure not covered by the mask, the etching has removed the silicon oxide layer 28, the polycrystalline silicon layer 27 and the silicon oxide layer 24.

The etching agent is chosen to ensure selective etching of silicon oxide compared to polycrystalline silicon-germanium, the polycrystalline silicon-germanium layer 23 serving as etching stop layer.

Figure 12:
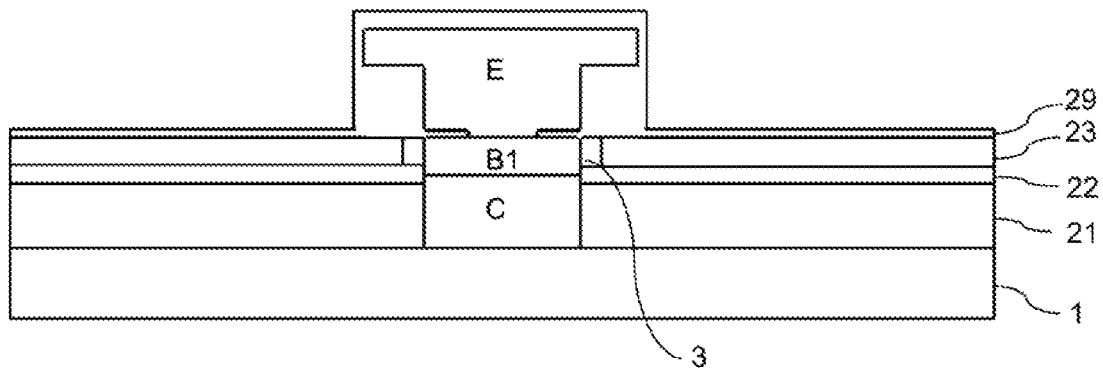
FIG. 12 is a schematic sectional view of the structure of FIG. 11 after deposition of an encapsulation layer around the emitter.

With reference to FIG. 12, a silicon oxide layer 29 has been deposited making it possible to encapsulate the emitter.

Said layer 29 is deposited in a conformal manner on the polycrystalline silicon-germanium layer 23, on the silicon oxide layer 28 and on the lateral edges of the emitter.

Figure 13:
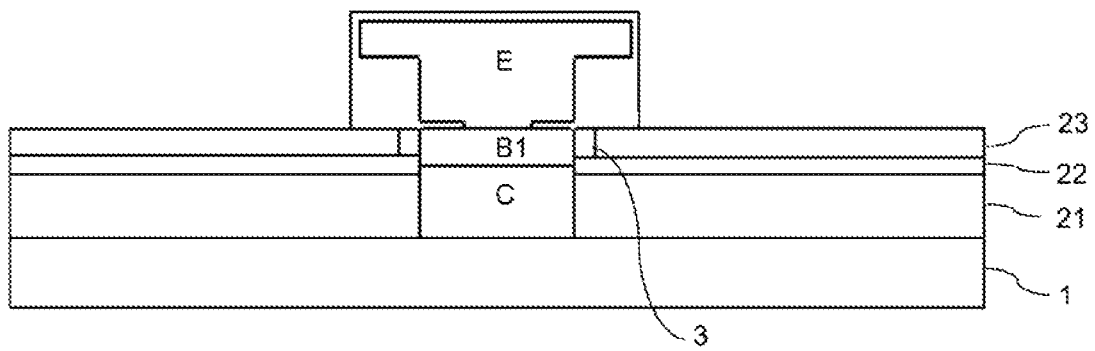
FIG. 13 is a schematic sectional view of the structure of FIG. 12 after localized etching of the encapsulation layer.

With reference to FIG. 13, the silicon oxide layer 29 present on the surface of the silicon-germanium layer 23 has been etched. Said etching is anisotropic, so as to preserve the silicon oxide encapsulating the upper surface and the lateral edges of the emitter E. The polycrystalline silicon-germanium layer 23 serves as etching stop layer.

Figure 14:
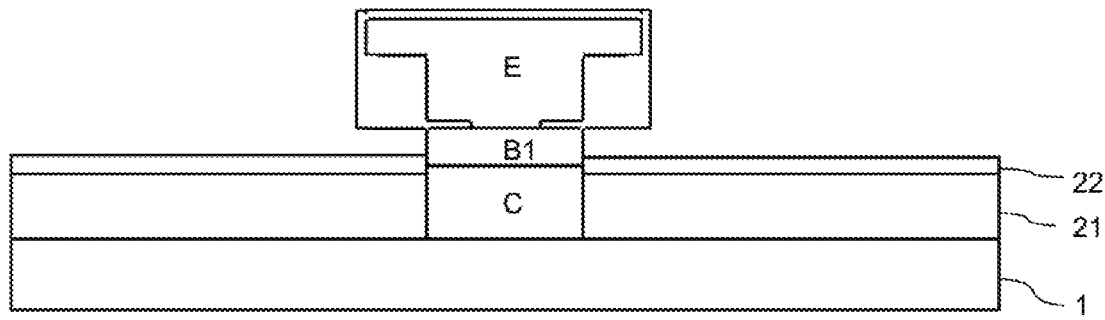
FIG. 14 is a schematic sectional view of the structure of FIG. 13 after removal of the polycrystalline silicon-germanium layer.

With reference to FIG. 14, an etching of the polycrystalline silicon-germanium layer 23 has been implemented. The etching agent is chosen to ensure selective etching of polycrystalline silicon-germanium compared to the other materials of the structure, notably compared to the material of the intrinsic part B1 of the base and the material of the layer 22.

This etching exposes the upper part of the lateral edges of the intrinsic part B1 of the base, the base-collector junction being surrounded by the silicon nitride layer 22.

Figure 15:
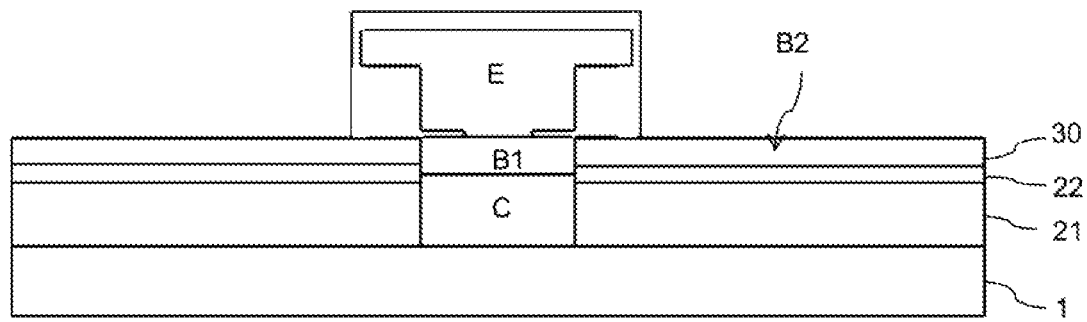
FIG. 15 is a schematic sectional view of the structure of FIG. 14 after selective deposition of a semiconductor layer forming the extrinsic part of the base of the bipolar transistor.

With reference to FIG. 15, a semiconductor layer 30 has been deposited on the silicon nitride layer 22. The semiconductor material of the layer 30 is chosen to be deposited selectively on the silicon nitride, and not on the silicon oxide. The silicon nitride not being a monocrystalline material, the semiconductor material of the layer 30 is typically polycrystalline. According to a preferred embodiment, the material of the layer 30 is polycrystalline silicon doped with the same type as the base.

The deposition of the layer 30 may be stopped from the moment where the upper surface of said layer has reached the lower surface of the emitter E. Thus, the layer 30 completely fills the set-back region under the emitter, and is in electrical contact with the upper part of the base B. The layer 30 thus fulfils the function of extrinsic part B2 of the base.

Figure 16A:
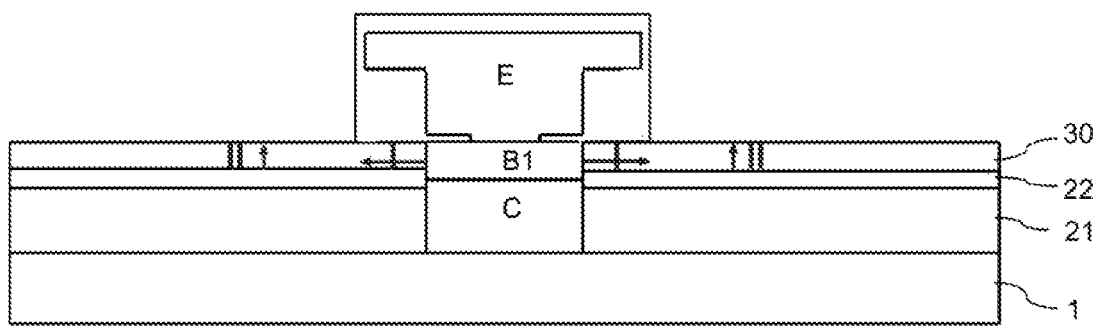
FIG. 16A is a schematic sectional view of the steps of said selective deposition according to a first embodiment.

According to an embodiment, illustrated in FIG. 16A, the growth of the layer 30 may be carried out firstly from the exposed edges of the intrinsic part B1 of the base, in a direction parallel to the main surface of the structure (direction represented by the arrow I), then from the surface of the layer 22 of the silicon nitride layer, in the direction perpendicular to the surface of the layer 22 (direction represented by the arrow II). To this end, firstly a selective epitaxy is implemented enabling growth of the material of the layer 30 uniquely from the silicon-germanium of the intrinsic part of the base, then a selective epitaxy enabling growth of the material of the layer 30 also from the silicon nitride of the layer 22.

Figure 16B:
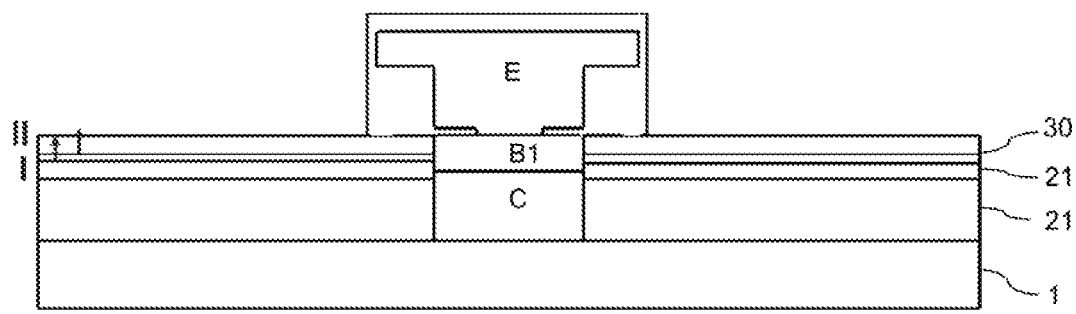
FIG. 16B is a schematic sectional view of the steps of said selective deposition according to a second embodiment.

According to an alternative embodiment, illustrated in FIG. 16B, the growth of the layer 30 may be carried out in two steps in the direction perpendicular to the main surface of the structure. In a first step (shown schematically by the arrow I), a thin layer of silicon may firstly be deposited on the layer 22. In a second step (shown schematically by the arrow II), P doped polycrystalline silicon is deposited on the thin layer of silicon to form the remainder of the layer 30. The prior deposition of such a thin silicon layer may be advantageous to ensure sufficient selectivity of the deposition of the polycrystalline silicon layer vis-à-vis the oxide encapsulating the emitter. Given its low thickness, the silicon layer deposited in the first step does not fulfil the electrical function. The electrical function of the extrinsic part B2 of the base is ensured by the polycrystalline silicon layer deposited in the second step.

Figure 1:
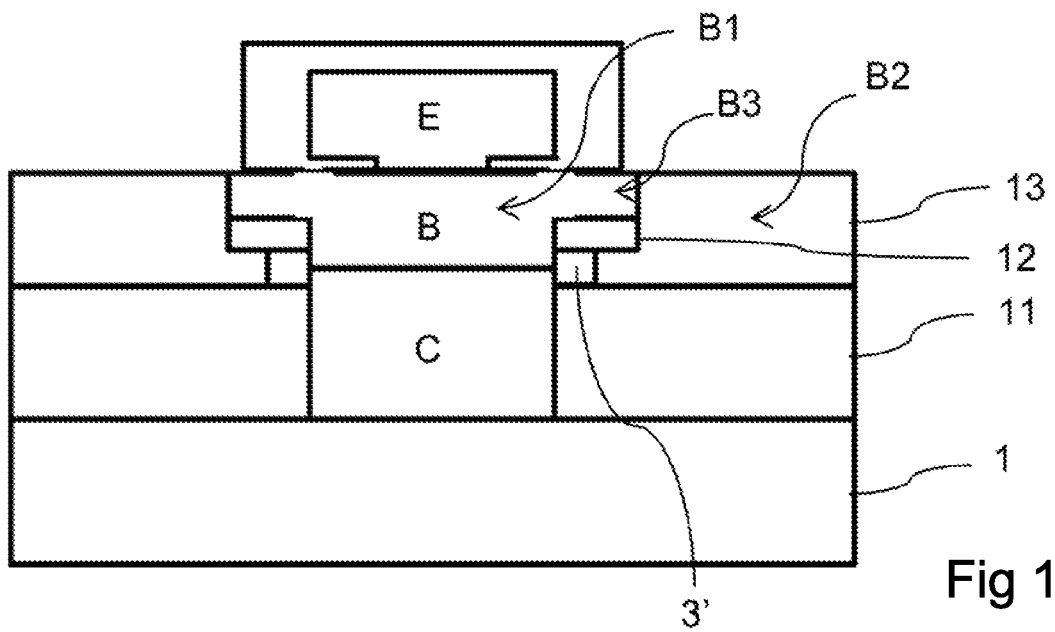
FIG. 1 is a schematic sectional view of a bipolar transistor comprising an air gap around the junction between the base and the collector.

Thus, thanks to the judicious choice of the materials forming the stack deposited on the substrate in terms of etching and/or deposition selectivity, the method described in the present text has the following advantages compared to the method for manufacturing the bipolar transistor of FIG. 1. On the one hand, the air gap formed around the intrinsic part of the base makes it possible to improve the crystalline quality of the base. On the other hand, the electrical insulation of the base—collector junction vis-à-vis the extrinsic part of the base is ensured by an electrically insulating layer (namely the silicon nitride layer 22 in the embodiment illustrated in the figures), which is in direct contact with the base and the collector on either side of said junction; the difficulties linked to the control of an air gap are thus avoided. Finally, the number of steps implemented is reduced, notably as regards the realization of the connection between the intrinsic part and the extrinsic part of the base.

The bipolar transistor thus obtained is thus more robust while being easier to manufacture on an industrial scale.

Furthermore, the steps implemented for the manufacture of said bipolar transistor being compatible with the steps for manufacturing CMOS transistors, this method lends itself well to the co-integration of bipolar and CMOS transistors (designated by the term BiCMOS).

The invention claimed is:

1. A method for manufacturing a bipolar transistor including a collector, a base and an emitter, comprising:
   forming, on a semiconductor substrate, a stack of adjacent layers successively comprising: a first layer, a second layer, a third layer and a fourth layer, wherein each of the first, second, third and fourth layers is able to be etched selectively compared to each adjacent layer, the first, second and fourth layers being electrically insulating and wherein the third layer is made of polycrystalline silicon-germanium;
   forming an opening in the stack that reaches the semiconductor substrate;
   performing an epitaxial process within said opening in the stack that grows the collector of the bipolar transistor on the semiconductor substrate and etches an annular opening in the third layer;
   forming by epitaxy an intrinsic part of the base on the collector, said intrinsic part of the base being separated from the third layer by an air gap formed in the annular opening, wherein a junction between the collector and the intrinsic part of the base is surrounded by the second layer;
   forming the emitter on the intrinsic part of the base;
   removing the polycrystalline silicon-germanium third layer by selective etching; and
   selectively depositing a semiconductor layer on the second layer, in an area where the polycrystalline silicon-germanium third layer was removed and in direct contact with the intrinsic part of the base, so as to form an extrinsic part of the base of the bipolar transistor.

2. The method according to claim 1, wherein forming the emitter comprises:
   forming an opening in the fourth layer that reaches the intrinsic part of the base; and
   non-selective depositing a semiconductor material on the fourth layer and on the intrinsic part of the base.

3. The method according to claim 1, wherein forming the extrinsic part of the base comprises:
   a first phase of growing the semiconductor layer laterally from an edge of the intrinsic part of the base;
   followed by a second phase of growing the semiconductor layer from a surface of the second layer in a direction perpendicular to said surface.

4. The method according to claim 1, wherein forming the extrinsic part of the base comprises:

a phase of depositing a first semiconductor layer on the second layer;
followed by selective depositing of the semiconductor layer on said first semiconductor layer.

5. The method according to claim 1, wherein the first, second and fourth layers are formed of a material selected from the group consisting of: silicon oxide and silicon nitride.

6. The method according to claim 5, wherein the first and fourth layers are made of silicon oxide and the second layer is made of silicon nitride.

7. The method according to claim 1, wherein the semiconductor layer forming the extrinsic part of the base is made of polycrystalline silicon.

8. The method according to claim 1, wherein the intrinsic part of the base is made of silicon-germanium.

9. The method according to claim 8, wherein a germanium content of the polycrystalline silicon-germanium third layer is at least 1.5 times higher than a germanium content of the intrinsic part of the base.

10. The method according to claim 1, further comprising, before forming the emitter, forming spacers on the intrinsic part of the base.

11. The method according to claim 10, wherein forming the spacers comprises:
depositing a silicon oxide layer on the intrinsic part of the base;
depositing a silicon nitride layer on the silicon oxide layer; and
forming an opening in said silicon nitride and silicon oxide layers that reaches the intrinsic part of the base so as to delimit said spacers in the silicon oxide layer.

12. A method for manufacturing a bipolar transistor including a collector, a base and an emitter, comprising:
forming a stack of layers on a semiconductor substrate, said stack of layers including an insulating layer and a polycrystalline semiconductor layer;
forming an opening through the stack of layers that reaches the semiconductor substrate;
performing an epitaxial process within said opening in the stack of layers that forms the collector of the bipolar transistor on the semiconductor substrate and etches an annular opening in the polycrystalline semiconductor layer;
epitaxially forming an intrinsic part of the base on the collector, wherein said intrinsic part of the base is separated from the polycrystalline semiconductor layer by the annular opening, wherein a junction between the collector and the intrinsic part of the base is surrounded by the insulating layer;
forming the emitter on the intrinsic part of the base;
removing the polycrystalline semiconductor layer by selective etching to access the annular opening; and
selectively depositing a conductive layer on the insulating layer and within the accessed annular opening where the polycrystalline semiconductor layer was removed and in direct contact with the intrinsic part of the base, so as to form an extrinsic part of the base of the bipolar transistor.

13. The method according to claim 12, wherein forming the emitter comprises non-selective depositing a semiconductor material on the intrinsic part of the base.

14. The method according to claim 13, wherein forming the extrinsic part of the base comprises:
a first phase of growing the conductive layer laterally from an edge of the intrinsic part of the base;
followed by a second phase of growing the conductive layer from a surface of the insulating layer in a direction perpendicular to said surface.

15. The method according to claim 14, wherein forming the extrinsic part of the base comprises:
a phase of depositing a first conductive layer on the insulating layer;
followed by selective depositing of a second conductive layer on said first conductive layer.

16. The method according to claim 14, wherein the insulating layer is formed of a material selected from the group consisting of: silicon oxide and silicon nitride.

17. The method according to claim 14, wherein the polycrystalline semiconductor layer is made of polycrystalline silicon-germanium.

18. The method according to claim 14, wherein the conductive layer forming the extrinsic part of the base is made of polycrystalline silicon.

19. The method according to claim 14, wherein the intrinsic part of the base is made of silicon-germanium.

20. The method according to claim 14, further comprising, before forming the emitter, forming spacers on the intrinsic part of the base.

21. A method for manufacturing a bipolar transistor including a collector, a base and an emitter, comprising:
forming, on a semiconductor substrate, a stack of adjacent layers successively comprising: a first layer, a second layer, a third layer and a fourth layer, wherein each of the first, second, third and fourth layers is able to be etched selectively compared to each adjacent layer;
forming an opening in the stack that reaches the semiconductor substrate;
performing an epitaxial process within said opening in the stack that grows the collector of the bipolar transistor on the semiconductor substrate and etches an annular opening in the third layer;
forming by epitaxy an intrinsic part of the base on the collector, wherein the annular opening is internally laterally delimited by an edge of said intrinsic part of the base to form an air gap between said edge of the intrinsic part of the base and the third layer;
wherein a junction between the collector and the intrinsic part of the base is surrounded by the second layer;
forming the emitter on the intrinsic part of the base;
removing the third layer by selective etching to access the air gap; and
selectively depositing a semiconductor layer on the second layer, in an area where the third layer was removed and the air gap was present, said semiconductor layer being in direct contact with the edge of the intrinsic part of the base so as to form an extrinsic part of the base of the bipolar transistor.

22. The method of claim 21, wherein the first, second and fourth layers are made of electrically insulating materials selected from the group consisting of: silicon oxide and silicon nitride and the third layer is made of polycrystalline semiconductor material.

23. The method according to claim 21, wherein forming the emitter comprises:
forming an opening in the fourth layer that reaches the intrinsic part of the base; and
non-selective depositing a semiconductor material on the fourth layer and on the intrinsic part of the base.

24. The method according to claim 21, wherein forming the extrinsic part of the base comprises:
a first phase of growing the semiconductor layer laterally from said edge of the intrinsic part of the base;

followed by a second phase of growing the semiconductor layer from a surface of the second layer in a direction perpendicular to said surface.

25. The method according to claim 21, wherein forming the extrinsic part of the base comprises:
   a phase of depositing a first semiconductor layer on the second layer;
   followed by selective depositing of the semiconductor layer on said first semiconductor layer.

26. The method according to claim 21, wherein the semiconductor layer forming the extrinsic part of the base is made of polycrystalline silicon.

27. The method according to claim 21, wherein the intrinsic part of the base is made of silicon-germanium.

28. The method according to claim 21, wherein the third layer is made of polycrystalline silicon-germanium, and wherein a germanium content of the third layer is at least 1.5 times higher than a germanium content of the intrinsic part of the base.

29. The method according to claim 21, further comprising, before forming the emitter, forming spacers on the intrinsic part of the base.

30. The method according to claim 29, wherein forming the spacers comprises:
   depositing a silicon oxide layer on the intrinsic part of the base;
   depositing a silicon nitride layer on the silicon oxide layer; and
   forming an opening in said silicon nitride and silicon oxide layers that reaches the intrinsic part of the base so as to delimit said spacers in the silicon oxide layer.

* * * * *